United States Patent [19]

Sakoh

[11] Patent Number: 5,641,991
[45] Date of Patent: Jun. 24, 1997

[54] SEMICONDUCTOR DEVICE CONTAINING CONDUCTOR PLUG THAT CAN REDUCE CONTACT RESISTANCE

[75] Inventor: Takashi Sakoh, Tokyo, Japan

[73] Assignee: NEC Corporation, Tokyo, Japan

[21] Appl. No.: 521,737

[22] Filed: Aug. 31, 1995

[30] Foreign Application Priority Data

Sep. 1, 1994 [JP] Japan .................... 6-232286

[51] Int. Cl.⁶ .................................. H01L 23/48
[52] U.S. Cl. .................. 257/755; 257/754; 257/756; 257/382; 257/384; 257/385
[58] Field of Search ................ 257/752, 754, 257/755, 382, 384, 385, 903

[56] References Cited

U.S. PATENT DOCUMENTS

| | | |
|---|---|---|
| 4,795,722 | 1/1989 | Welch et al. ................ 257/754 |
| 5,057,902 | 10/1991 | Haskell ...................... 257/754 |

FOREIGN PATENT DOCUMENTS

| | | |
|---|---|---|
| 3-185823 | 8/1991 | Japan . |
| 5243397 | 9/1993 | Japan ................ 257/755 |

Primary Examiner—Mahshid D. Saadat
Assistant Examiner—T. M. Arroyo
Attorney, Agent, or Firm—Sughrue, Mion, Zinn, Macpeak & Seas

[57] ABSTRACT

A lower-level conductor layer is formed in a surface of, on or over a semiconductor substrate. An interlayer insulator film is formed on the lower-level conductor layer. An upper-level conductor layer such as an interconnection layer of the semiconductor device is formed on the interlayer insulator film. A conductor plug is formed in a contact hole of the interlayer insulator film. The lower-level conductor layer and the upper-level conductor layer are electrically connected with each other through the conductor plug. A top part of the conductor plug protrudes from the interlayer insulator film. The upper-level conductor layer is contacted with a top face and a side face of the top part of the conductor plug. Both the contact resistance between the conductor contact and the upper-level conductor layer and the resistance of the upper-level conductor layer itself can be reduced without using a special equipment and a special process.

19 Claims, 9 Drawing Sheets

SEMICONDUCTOR DEVICE CONTAINING CONDUCTOR PLUG THAT CAN REDUCE CONTACT RESISTANCE

BACKGROUND OF THE INVENTION

1. Field of the Invention

The present invention relates to a semiconductor device and more particularly, to a semiconductor device that enables to realize finer contacts and interconnections.

2. Description of the Prior Art

In recent years, conductor contacts in a semiconductor device have been becoming slenderer and interconnections therein have been becoming narrower due to increase in the integration scale of components. Such the slenderized contacts and narrowed interconnections cause increase in not only contact resistance but also interconnection resistance. Therefore, it has become important for the semiconductor device to reduce the contact and interconnection resistances as low as possible.

To form the slenderized contacts, it is required that miniaturized (or small-diameter) contact holes are formed in an insulator layer and that the contact holes are filled with a conductor material so that uniform step coverage is obtained. Such the conductor contacts have been realized by a conventional "conductor plug" technique. In this technique, a conductor layer is formed on an interlayer insulator film to fill contact holes of the interlayer insulator film and then, the conductor layer is etched back to be left only in the contact holes as conductor plugs.

Also, to form the narrowed interconnections having a low resistance, a "self-aligned silicide" technique has been developed. In this technique, a metal layer is deposited on a patterned silicon layer and then, the metal layer reacts with the silicon layer to produce a metal silicide layer at their interface. The unreacted metal layer is then removed, resulting in a patterned metal silicide layer placed on the patterned metal layer in self-alignment.

FIGS. 1C to 1F show a conventional fabrication method of a semiconductor device, in which the above conductor plug and self-aligned silicide techniques are employed.

First, an impurity-doped region or diffusion region 22 is formed in the surface area of a silicon substrate 21 as a conductor layer. An interlayer insulator film 23 is then formed on the substrate 21 to cover the region 22. A patterned photoresist film 26 is formed on the interlayer insulator film 23 by a photolithography technique. Using the patterned photoresist film 26 as a mask, the interlayer insulator film 23 is selectively etched until the impurity-doped region 22 is exposed from the film 23 by a reactive ion etching technique, producing a penetrating contact hole 27 in the film 23. The state at this time is shown in FIG. 1A.

Next, after removing the photoresist film 26, a first phosphorus-doped polysilicon layer 28 is deposited on the entire interlayer insulator film 23 by a Low-Pressure Chemical Vapor Deposition (LPCVD) technique. During this CVD process, as shown in FIG. 1B, the contact hole 27 is filled with the phosphorus-doped polysilicon.

The first polysilicon layer 28 is then etched back entirely by a reactive ion etching technique to be left only in the contact hole 27, producing a polysilicon plug 29 in the hole 27, as shown in FIG. 1C. The bottom end of the plug 29 is contacted with the impurity-doped region 22 and the top end thereof is slightly lower than the surface of the interlayer insulator film 23.

A second phosphorus-doped polysilicon layer 24 is formed on the entire interlayer insulator film 23 by a LPCVD technique and then, a patterned photoresist film 30 is formed on the layer 24 by a photolithography technique. Using the patterned photoresist film 30 as a mask, the second polysilicon layer 24 is selectively etched by a reactive ion etching technique to be patterned to a desired interconnection shape, as shown in FIG. 1D.

After the photoresist film 30 is removed, a titanium (Ti) layer 31 is formed on the remaining second polysilicon layer 24 and the exposed interlayer insulator film 23 by a sputtering technique, as shown in FIG. 1E. Then, the two layers 31 and 24 are subjected to a heat-treatment to react with each other, producing selectively a titanium silicide ($TiSi_2$) layer at the interface between the layers 31 and 24.

Finally, the unreacted titanium layer 31 and reaction products such as a titanium nitride (TiN) are removed, resulting in a patterned silicide layer 32 on the remaining polysilicon layer 24. Thus, the silicide layer 32 is selectively formed in self-alignment with the underlying polysilicon layer 24. The patterned polysilicon layer 24 and the patterned silicide layer 32, which form a polycide structure, constitute an interconnection or wiring 35 of the semiconductor device.

With the above-described conventional fabrication method, the following problems occur.

During the process step of forming the second polysilicon layer 24 (FIG. 1D), a native oxide layer 33 of $SiO_2$ tends to be generated at the interface between the polysilicon plug 29 and the second polysilicon layer 24. The native oxide layer 33 is produced due to inadvertent oxidation of the plug 29 during the loading of the substrate 21 into a CVD chamber. The layer 33 causes the increase of the contact resistance between the plug 29 and the layer 24.

Also, during the process step of forming the plug 29 (FIG. 1C), the top of the first polysilicon layer 28 in the contact hole 27 is slightly overetched, resulting in the depression on the remaining polysilicon plug 29. Consequently, the second polysilicon layer 24 is contacted with the polysilicon plug 29 only at the top face of the plug 29.

Further, when the phosphorus concentration of the second polysilicon layer 24 is high, the contact resistance can be prevented from increasing. However, such the high phosphorus concentration decreases the silicide reaction rate so that the silicidation rate of titanium becomes low, making the TiSi2 layer 32 thinner. This results in the resistance increase of the interconnection 35.

On the other hand, when the phosphorus concentration of the second polysilicon layer 24 is low, the resistance of the interconnect 35 can be restrained. However, the resistance between the polysilicon plug 29 and the titanium silicide layer 32 increases because the second polysilicon layer 24 having the high resistance is provided therebetween. This also leads to the resistance increase of the interconnection 35.

The Japanese Non-Examined Patent Publication No. 3-185823, which was published in August 1991, discloses a measure to remove the native oxide layer 33. In this measure, although the native oxide layer 33 is effectively removed by a chemically dry etching process, another native oxide layer will be generated again due to exposure to the atmosphere or air after the chemically dry etching process. Therefore, this method does not provide a basic or fundamental solution for this problem.

To cancel or avoid the generation of the native oxide layer completely, the substrate 21 is essential to be loaded into a CVD chamber used for the formation of the second polysilicon layer 24 without exposure to the atmosphere (i.e., while keeping the vacuum condition) after the chemically dry etching process. This requires a very expensive multi-chamber equipment.

SUMMARY OF THE INVENTION

Accordingly, an object of the present invention is to provide a semiconductor device that can reduce both the contact resistance between a conductor contact and a conductor layer such as an interconnection layer and the resistance of the conductor layer itself without using a special equipment and a special process.

Another object of the present invention is to provide a semiconductor device that enables to prevent a native oxide layer that tends to be produced during a fabrication process sequence from affecting the contact resistance.

According to a first aspect of the present invention, a semiconductor device is provided. This device contains a lower-level conductor layer formed on or over a semiconductor substrate, an interlayer insulator film that is formed on the lower-level conductor layer and that has a penetrating hole, an upper-level conductor layer formed on the interlayer insulator film; and a conductor plug formed in the hole of the interlayer insulator film. The lower-level conductor layer and the upper-level conductor layer are electrically connected with each other through the conductor plug. A top part of the conductor plug protrudes from the interlayer insulator film. The upper-level conductor layer is contacted with a top face and a side face of the top part of the conductor plug.

With the semiconductor device according to the first aspect, the top part of the conductor plug protrudes from the interlayer insulator film and the upper-level conductor layer is contacted with the top face and the side face of the top part. Consequently, the conductor plug and the upper-level conductor layer are contacted with at a wider contact area than that of the above conventional semiconductor device, which provides a reduced contact resistance between the conductor plug and the upper-level conductor layer.

According to a second aspect of the present invention, another semiconductor device is provided. This device contains a lower-level conductor layer formed on or over a semiconductor substrate, an interlayer insulator film that is formed on the lower-level conductor layer and that has a first hole, and an upper-level conductor layer formed on the interlayer insulator film.

The upper-level conductor layer contains a silicon sublayer formed on the interlayer insulator film and a metal silicide sublayer formed on the silicon sublayer. The silicon sublayer has a second hole positioned right over the first hole of the interlayer insulator film.

The device further has a conductor plug formed in the first and second holes. A bottom end of the conductor plug is contacted with the lower-level conductor layer. A top part of the conductor plug protrudes from the silicon sublayer. The metal silicide sublayer covers the protruding top part of the conductor plug and is contacted with a top face and a side face of the top part. The lower-level conductor layer and the upper-level conductor layer are electrically connected with each other through the conductor plug.

With the semiconductor device according to the second aspect, the top part of the conductor plug protrudes from the silicon sublayer of the upper-level conductor layer, and the silicide sublayer is contacted with the top face and the side face of the top part. Consequently, the conductor plug and the silicide sublayer are contacted with at a wider contact area than that of the above conventional semiconductor device, which provides a reduced contact resistance between the conductor plug and the upper-level conductor layer.

Also, since the protruding top part of the conductor plug is directly contacted with the silicide sublayer of the upper-level conductor layer, there is an advantage that the contact resistance between the plug and the upper-level conductor layer does not increase even if the silicon sublayer is doped with no impurity or is lightly doped with an impurity. This enables to enhance the silicidation reaction rate during the formation process of the silicide sublayer, making the silicide sublayer sufficiently thicker, i.e., making the resistance of the upper-level conductor layer lower.

Because of the direct contact of the conductor plug with the silicide sublayer, the effect of a native oxide layer to the contact resistance can be prevented.

In the semiconductor devices of the first and second aspects, the conductor plug is preferably made of polysilicon. The lower silicon sublayer is preferably made of polysilicon or amorphous silicon. The silicide sublayer is preferably made of a silicide of any refractory metal such as titanium (Ti) and tungsten (W).

DETAILED DESCRIPTION OF THE PREFERRED EMBODIMENTS

Figure 1A:
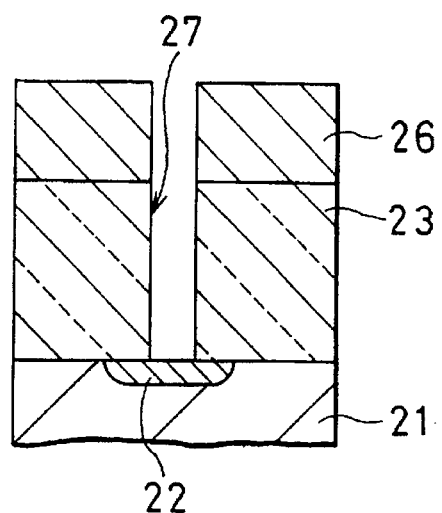
FIGS. 1A to 1F are partial cross-sectional views of a semiconductor device showing a conventional fabrication method, respectively.
Figure 1B:
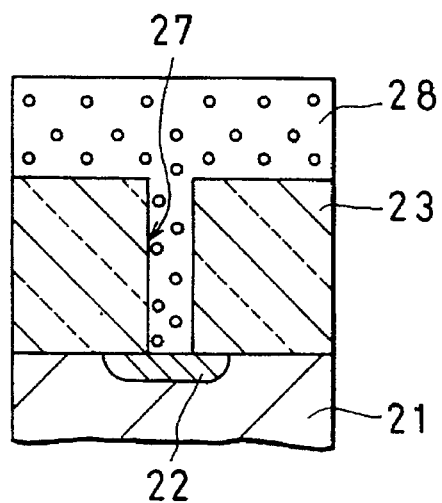
Figure 1C:
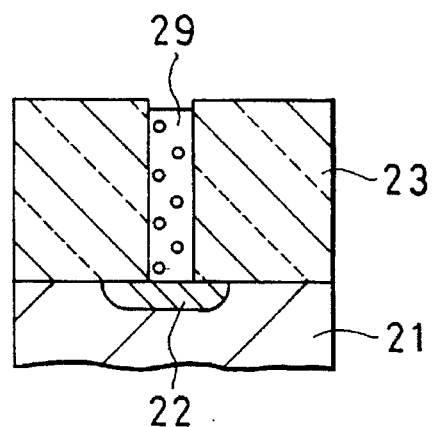
Figure 1D:
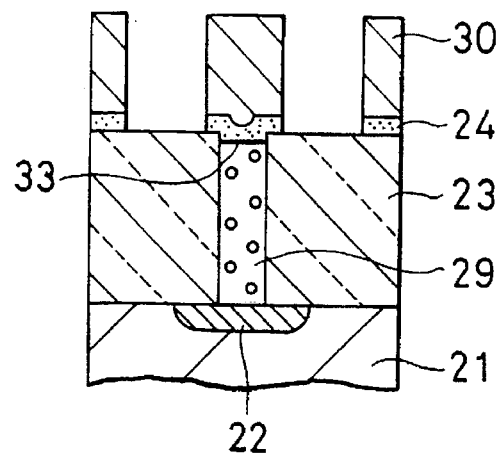
Figure 1E:
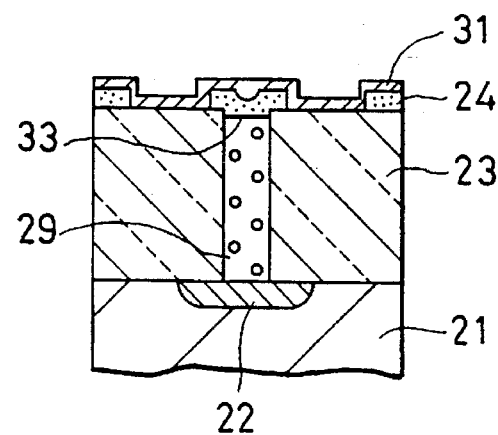

Preferred embodiments of the present invention will be described below while referring to the drawings attached.

FIRST EMBODIMENT

A semiconductor device according to a first embodiment is shown in FIGS. 2A to 2F and 5, in which only one impurity-doped region and one contact hole are drawn for the sake of simplification of description.

Figure 2A:
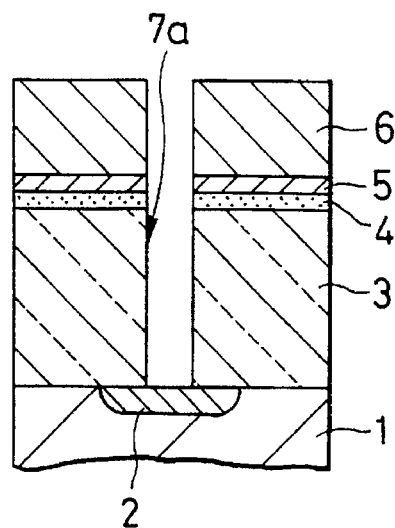
FIGS. 2A to 2F are partial cross-sectional views of a semiconductor device according to a first embodiment of the invention, which show its fabrication method, respectively.
Figure 2B:
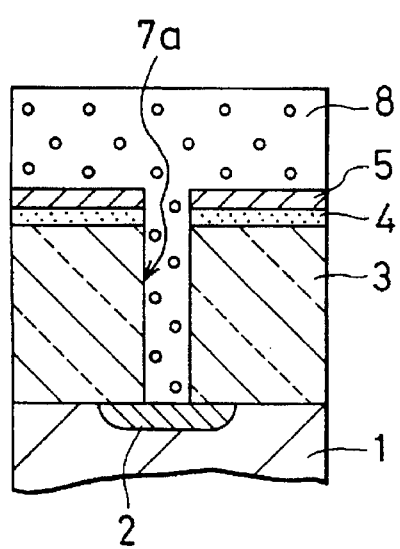
Figure 2C:
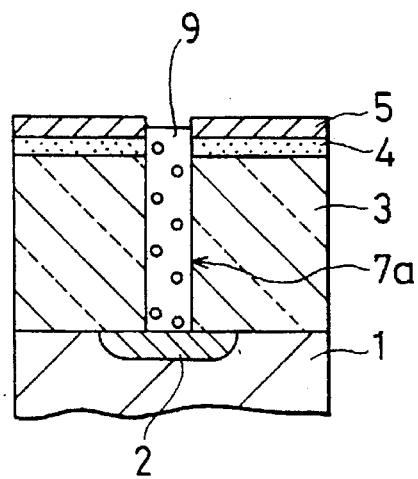
Figure 2D:
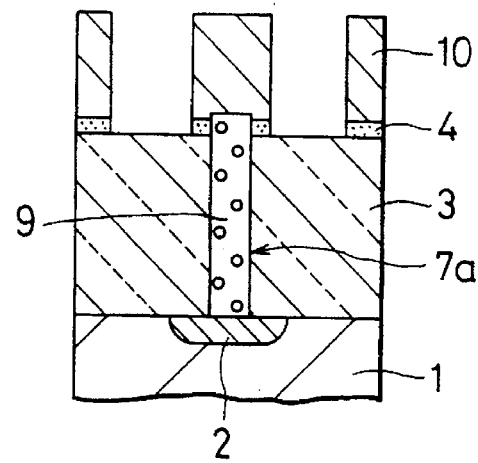
Figure 2E:
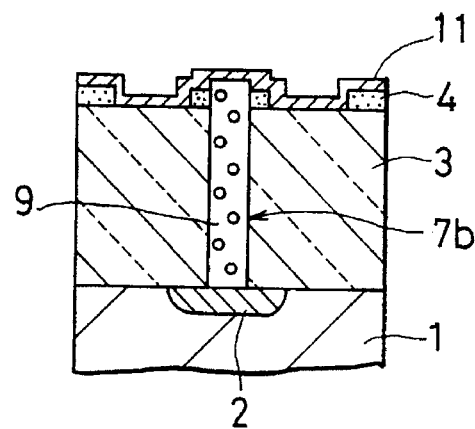
Figure 2F:
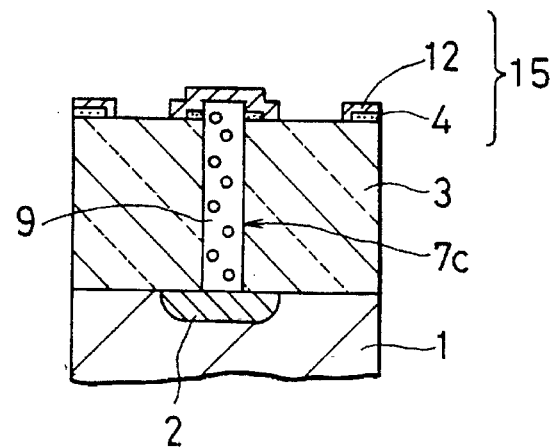

As shown in FIG. 2F, an impurity-doped region or diffusion region 2 as a lower-level conductor is formed in the surface area of a silicon substrate 1. An interlayer insulator film 3 is formed on the substrate 1 to cover the region 2. A patterned polysilicon layer 4 doped with no impurity is formed on the interlayer insulator film 3. A patterned $TiSi_2$ layer 12 is selectively formed on the polysilicon layer 4 in self-alignment with the layer 4. The polysilicon layer 4 and the $TiSi_2$ layer 12, which form a polycide structure, constitute an interconnection 15 of the semiconductor device. These two layers 4 and 12 act as an upper-level conductor.

A contact hole 7c is formed at a position right over the region 2 to vertically penetrate the polysilicon layer 4 and the interlayer insulator film 3. The impurity-doped region 2 is exposed from the film 3 and layer 4 through the hole 7c.

A polysilicon plug 9 as a conductor contact is formed in the contact hole 7c; in other words, the hole 7c is filled with the plug 9. The bottom end of the plug 9 is contacted with the impurity-doped region 2 and the top end of the plug 9 protrudes from the polysilicon layer 4.

Figure 5:
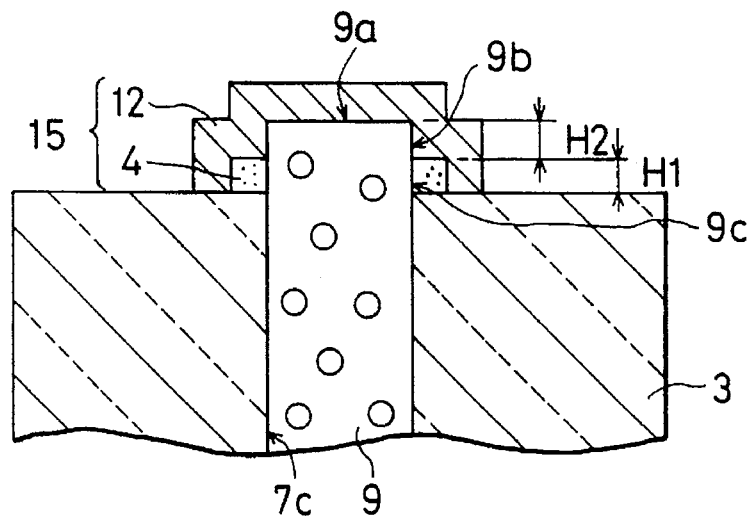
FIG. 5 is an enlarged, partial cross-sectional view of the semiconductor device according to the first embodiment.

Specifically, as shown in FIG. 5, a top part of the polysilicon plug 9 protrudes from the interlayer insulator film 3 by a height ($H_1+H_2$), and it protrudes from the polysilicon layer 4 by a height $H_2$. An end face 9a of the protruding top part of the plug 9 and a side face 9b thereof are contacted with the TiSi$_2$ layer 12. An underlying side face 9c of the protruding top part of the plug 9 is contacted with the polysilicon layer 4 in the contact hole 7c.

The impurity-doped region 2 is electrically connected with the interconnection 15 with the TiSi$_2$/polysilicon polycide structure through the polysilicon plug 9.

With the above semiconductor device according to the first embodiment, the top part of the polysilicon plug 9 protrudes from the interlayer insulator film 3, and the end face 9a and the side face 9b of the top part are contacted with the TiSi$_2$ layer 12 of the interconnection 15. The side face 9c of the top part of the plug 9 is contacted with the polysilicon layer 4 of the interconnection 15.

Figure 1F:
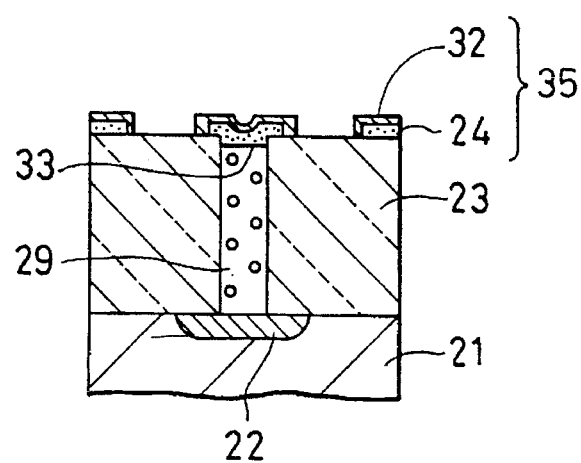

Consequently, the plug 9 and the interconnection 15 are contacted with each other at a wider contact area than that of the above conventional semiconductor device of FIG. 1F. This provides a reduced contact resistance between the plug 9 and the interconnection 15.

Also, unlike the case of the conventional one of FIGS. 1A to 1F, the plug 9 is directly contacted with the TiSi$_2$ layer 12 at the top face 9a of the plug 9 and the side face 9b thereof. Therefore, there is an advantage that no increase occurs in the contact resistance between the plug 9 and the interconnection 15 even if the polysilicon layer 4 is doped with no impurity or is lightly doped with an impurity, i.e., the layer 4 is high in resistance. This enables to enhance the silicide reaction rate during the formation process (FIG. 2E) of the TiSi$_2$ layer 12, making the layer 12 sufficiently thicker to reduce the resistance of the interconnection 15 itself.

Because of the direct contact of the polysilicon plug 9 with the TiSi$_2$ layer 12, the effect of a native oxide layer to the contact resistance can be prevented.

Next, a fabrication method of the semiconductor device according to the first embodiment is described below referring to FIGS. 2A to 2F.

First, as shown in FIG. 2A, the impurity-doped region 2 is formed in the surface area of the substrate 1 by a diffusion or ion-implantation technique. The interlayer insulator film 3 of 0.5 μm in thickness is then formed on the substrate 1 to cover the region 2. The undoped polysilicon layer 4 of 0.05 μm in thickness is formed on the interlayer insulator film 3. A silicon dioxide (SiO$_2$) layer 5 of 0.05 μm in thickness is formed on the polysilicon layer 4.

A patterned photoresist film 6 is formed on the SiO$_2$ layer 5 by a photolithography technique. The film 6 has a window at a corresponding position to the impurity-doped region 2. Using the patterned photoresist film 6 as a mask, the SiO$_2$ layer 5, the polysilicon layer 4 and the interlayer insulator film 3 are selectively etched until the impurity-doped region 2 is exposed from the film 3 by a reactive ion etching technique, producing a hole 7a penetrating the SiO$_2$ layer 5, the polysilicon layer 4 and the interlayer insulator film 3. The hole 7a has a diameter of 0.2 μm. The state at this time is shown in FIG. 2A.

Next, after removing the photoresist film 6, a phosphorus-doped polysilicon layer 8 of 0.6 μm in thickness is deposited on the entire SiO2 layer 5 by a LPCVD technique. During this CVD process, as shown in FIG. 2B, the hole 7a is filled with the phosphorus-doped polysilicon.

The first polysilicon layer 8 is then etched back entirely by a reactive ion etching technique to be left only in the hole 7a, producing a polysilicon plug 9 in the hole 7a, as shown in FIG. 2C. The bottom of the plug 9 is contacted with the impurity-doped region 2 and the top end thereof is slightly lower than the surface of the SiO$_2$ layer 5. The SiO$_2$ layer 5 is then removed. Thus, the top part of the plug 9 protrudes slightly from the polysilicon layer 4.

Subsequently, a patterned photoresist film 10 is formed on the polysilicon layer 4 by a photolithography technique. Using the patterned photoresist film 10 as a mask, the polysilicon layer 4 is selectively etched by a reactive ion etching technique to be patterned to a desired interconnection shape, as shown in FIG. 2D.

After the photoresist film 10 is removed, a Ti layer 11 of 0.03 μm in thickness is formed on the remaining polysilicon layer 4, the protruding polysilicon plug 9, and the exposed interlayer insulator film 3 by a sputtering technique, as shown in FIG. 2E. Then, the polysilicon layer 4 and the Ti layer 11 are subjected to a heat-treatment to react with each other, producing selectively a TiSi$_2$ layer 12 at the interface between the layers 4 and 12.

Finally, the unreacted Ti layer 11 and reaction products such as TiN are removed, resulting in the patterned silicide layer 12 formed on the remaining polysilicon layer 4. Thus, the silicide layer 12 is selectively formed in self-alignment with the underlying polysilicon layer 4. In other words, the polycide structure of the interconnection 15 is obtained by using the conventional self-aligned silicide technique.

With the fabrication method shown in FIGS. 2A to 2F, the polysilicon layer 4 of the interconnection 15 is formed and then, the silicon plug 9 is formed to protrude slightly from the layer 4. Therefore, the plug 9 can be directly contacted with the TiSi$_2$ layer 12. From this reason, a native oxide layer, which tends to be produced at the interface between the plug 9 and the polysilicon layer 12, scarcely affects the contact resistance between the plug 9 and the interconnection 15.

Also, since the interlayer insulator film 3 is covered with the SiO$_2$ layer S during the formation process (FIGS. 2B and 2C) of the polysilicon plug 9, the interlayer insulator film 3 is prevented from being affected by the etching-back process. This means that the thickness reduction of the film 3 is ensured to be avoided.

Further, because the contact resistance increases due to the native oxide layer can be avoided, no native oxide removal process using a hydrofluoric acid is necessary. This also leads to prevention of the thickness reduction of the interlayer insulator film 3.

In the first embodiment, the undoped polysilicon layer 4 is employed to obtain a lower-resistance interconnection 15 because the silicidation reaction rate increases as the dopant concentration of the polysilicon layer 4 decreases. However, the polysilicon layer 4 may be doped with any impurity such as phosphorus (P) or arsenic (As) as long as a metal silicide layer having a desired thickness is obtained.

The test results by the inventor indicated that a preferred dopant concentration of the polysilicon layer 4 was less than $1 \times 10^{20}$ atoms/cm$^3$.

SECOND EMBODIMENT

A semiconductor device according to a second embodiment is shown in FIGS. 3A to 3F. Because the semiconductor device of the second embodiment is the same in structure as that of the first embodiment except for the interconnection, the description for the individual elements is omitted here by adding the same reference numerals to the corresponding elements for the sake of simplification.

Figure 3A:
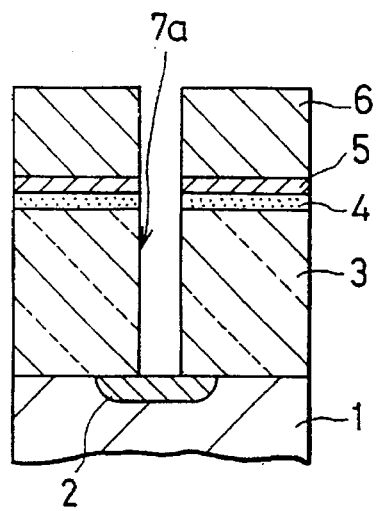
FIGS. 3A to 3F are partial cross-sectional views of a semiconductor device according to a second embodiment of the invention, which show its fabrication method, respectively.
Figure 3B:
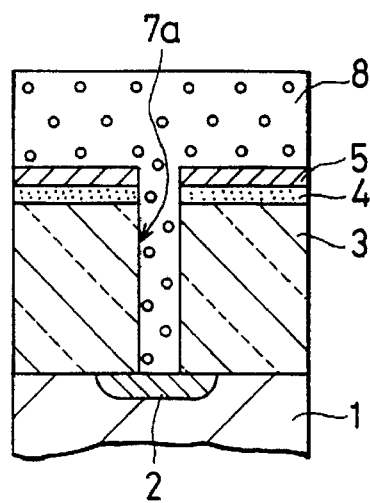
Figure 3C:
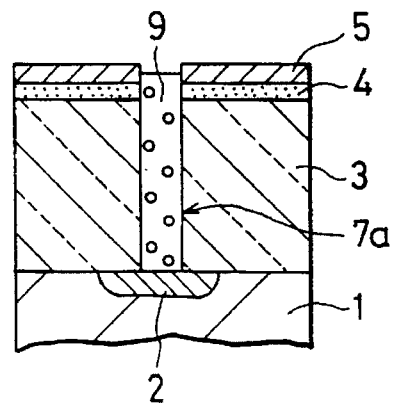
Figure 3D:
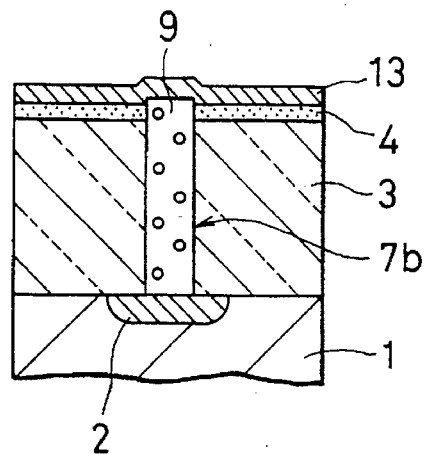
Figure 3E:
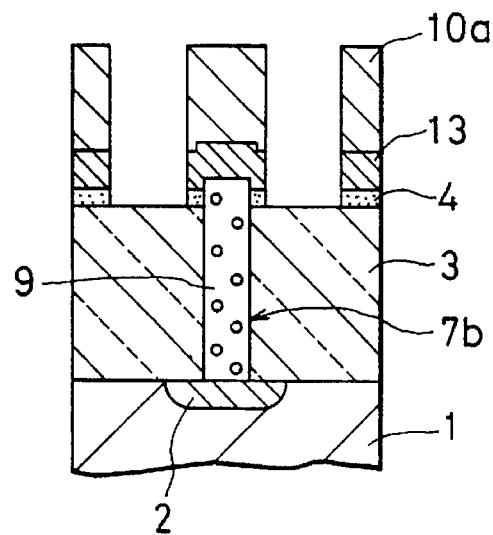
Figure 3F:
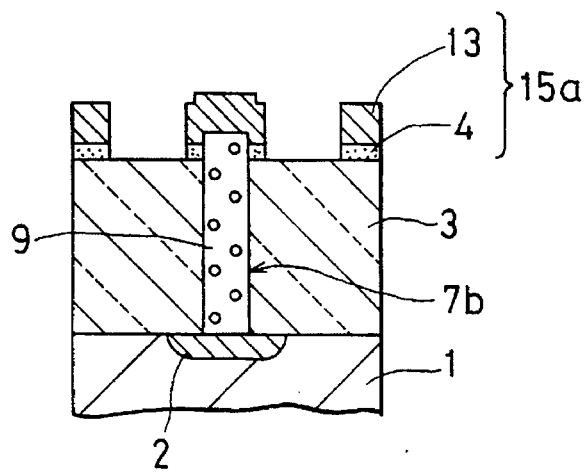

As shown in FIG. 3F, an interconnection 15a of the semiconductor device is composed of the patterned polysilicon layer 4 and a patterned tungsten silicide ($WSi_2$) layer 13, which form a polycide structure. The polysilicon layer 4 is doped with no impurity and is formed on the interlayer insulator film 3. The $WSi_2$ layer 13 is formed on the polysilicon layer 4 and the exposed polysilicon plug 9.

The polysilicon plug 9 is contacted with the polysilicon layer 4 and the $WSi_2$ layer 13 in the similar way as shown in FIG. 5. Specifically, the top part of the polysilicon plug 9 protrudes from the interlayer insulator film 3 by a height ($H_1+H_2$), and it protrudes from the polysilicon layer 4 by a height $H_2$. The end face 9a of the protruding top part of the plug 9 and the side face 9b thereof are contacted with the $WSi_2$ layer 13. The underlying side face 9c of the protruding top part of the plug 9 is contacted with the polysilicon layer 4 in the contact hole 7b.

The impurity-doped region 2 is electrically connected with the interconnection 15a with the $WSi_2$/polysilicon polycide structure through the polysilicon plug 9.

The semiconductor device according to the second embodiment is the same in structure as that of the first embodiment except that the $WSi_2$ layer 13 is provided instead of the $TiSi_2$ layer 12 and therefore, the same effects as those in the first embodiment can be obtained.

Next, a fabrication method of the semiconductor device according to the second embodiment is described below referring to FIGS. 3A to 3F.

The process steps shown in FIGS. 3A to 3C are the same as those in the first embodiment (FIGS. 2A to 2C).

After the entire $SiO_2$ layer 5 is removed from the polysilicon layer 4 in FIG. 3C, the $WSi_2$ layer 13 of about 0.1 µm in thickness is formed on the polysilicon layer 4 and the exposed polysilicon plug 9 by a CVD technique, as shown in FIG. 1. 3D. Then, a patterned photoresist film 10a is formed on the $WSi_2$ layer 13 by a photolithography technique. Using the patterned photoresist film 10a as a mask, the $WSi_2$ layer 13 and the polysilicon layer 4 are selectively etched by a reactive ion etching technique to be patterned to a desired interconnection shape, as shown in FIG. 3E. Finally, the photoresist film 10a is removed.

Thus, the $WSi_2$ layer 13 is formed on the underlying polysilicon layer 4, producing the $WSi_2$/polysilicon polycide structure of the interconnection 15a.

In the second embodiment, since the WSi2 layer 13 is directly formed in the polysilicon layer 4, no silicidation reaction is necessary. The polysilicon layer 4 is not always required. However, the layer 4 provides a superior adhesion of the WSi2 layer 13 with the polysilicon layer 4 and therefore, it is preferable that the layer 4 is formed on the interlayer insulator film 3. In view of this point, the polysilicon layer 4 is not necessary to be doped with no impurity or lightly doped with any impurity.

With the fabrication method shown in FIGS. 3A to 3F, after the polysilicon layer 4 of the interconnection 15a is formed, the silicon plug 9 is formed to protrude slightly from the layer 4. Therefore, the plug 9 can be directly contacted with the WSi2 layer 13. From this reason, a native oxide layer scarcely affects the contact resistance between the plug 9 and the interconnection 15a.

Also, since the interlayer insulator film 3 is covered with the $SiO_2$ layer 5 during the plug formation process of FIGS. 3B and 3C, the interlayer insulator film 3 is prevented from being affected by the etching-back process. This means that the thickness reduction of the film 3 is ensured to be avoided.

Further, because of no native oxide removal process using a hydrofluoric acid, the thickness reduction of the interlayer insulator film 3 can be avoided.

THIRD EMBODIMENT

A semiconductor device according to a third embodiment is shown in FIGS. 4A to 4F. Because the semiconductor device of the third embodiment is the same in structure as that of the first embodiment except for the interlayer insulator film, the description is omitted here by adding the same reference numerals to the corresponding elements for the sake of simplification.

Figure 4A:
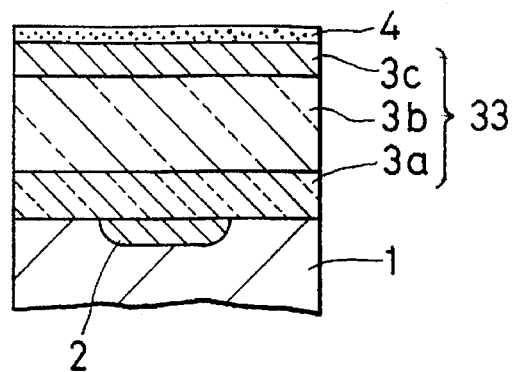
FIGS. 4A to 4F are partial cross-sectional views of a semiconductor device according to a third embodiment of the invention, which show its fabrication method, respectively.
Figure 4B:
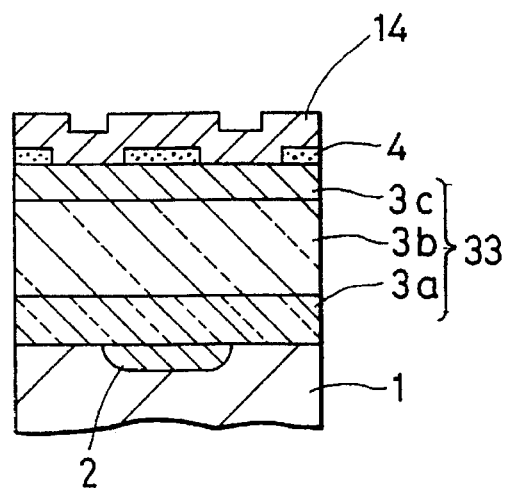
Figure 4C:
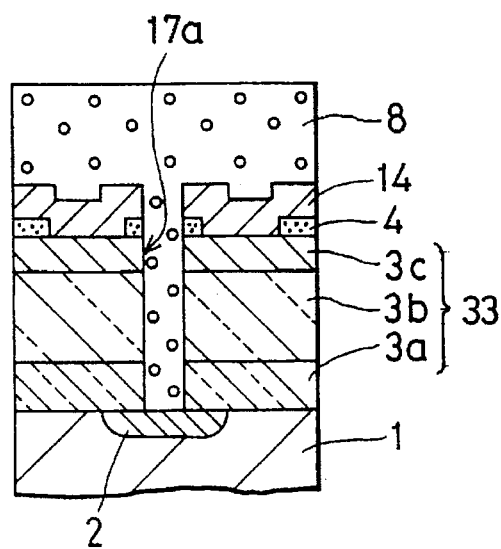
Figure 4D:
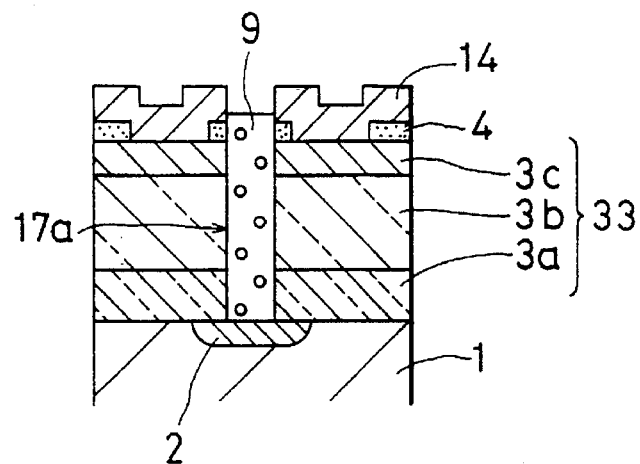
Figure 4E:
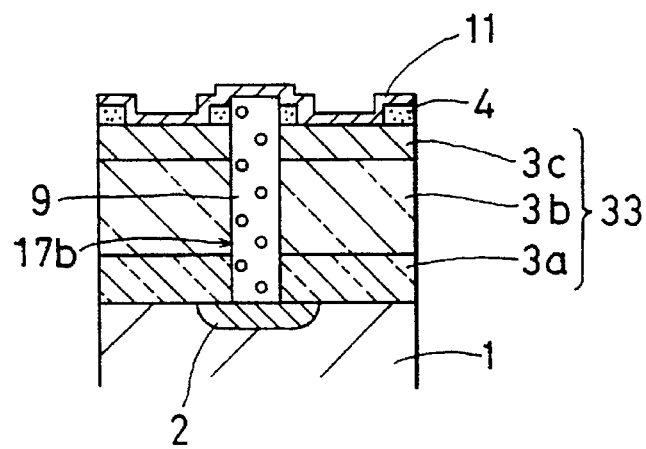
Figure 4F:
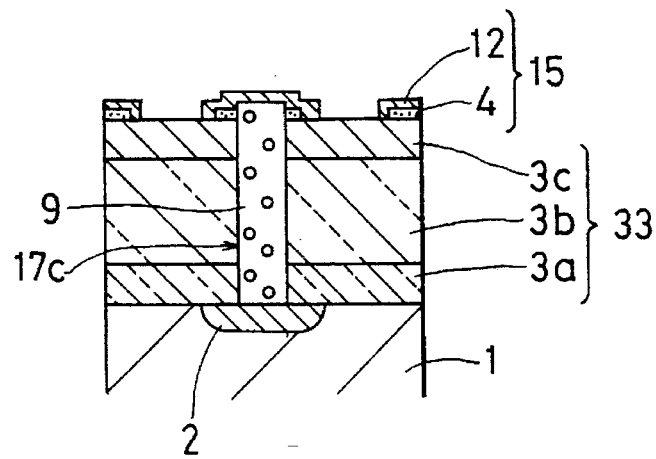

As shown in FIG. 4F, an interlayer insulator film 33 has a multilayer structure that is composed of an $SiO_2$ layer 3a, a BPSG layer 3b and an $SiO_2$ layer 3c. The polysilicon plug 9 is formed in a contact hole 17c that penetrating the interlayer insulator film 33 and the polysilicon layer 4.

The impurity-doped region 2 is electrically connected with the interconnection 15 with the $TiSi_2$/polysilicon polycide structure through the polysilicon plug 9.

The semiconductor device of the third embodiment has the same advantages or effects as those in the first embodiment.

A fabrication method of the semiconductor device according to the third embodiment is described below referring to FIGS. 4A to 4F.

First, as shown in FIG. 4A, the impurity-doped region 2 is formed in the surface area of the substrate 1 by a diffusion or ion-implantation technique. Then, the $SiO_2$ layer 3a of 0.1 µm in thickness, the BPSG layer 3b of 0.25 µm in thickness, and the $SiO_2$ layer 3c of 0.15 µm in thickness are successively formed on the substrate 1 to cover the region 2. The $SiO_2$ layer 3c needs to be doped with no impurity to facilitate the removal of a BPSG layer 14 formed on the layer 3c in a subsequent process.

The undoped polysilicon layer 4 of 0.05 µm in thickness is formed on the interlayer insulator film 33. The state at this stage is shown in FIG. 4A.

After a patterned photoresist film (not shown) is formed on the undoped polysilicon layer 4, the layer 4 is patterned to a desired interconnection shape by a reactive ion etching technique using the photoresist film as a mask, as shown in FIG. 4B. The photoresist film is then removed.

The BPSG layer 0.1 µm in thickness is formed on the patterned polysilicon layer 4 and the exposed $SiO_2$ layer 3c of the interlayer insulator film 33, as shown in FIG. 4B.

Next, using photolithography and etching techniques, a contact hole 17a is formed to penetrate the BPSG layer 14, the polysilicon layer 4 and the interlayer insulator film 33, exposing the impurity-doped region 2 from the film 33. The hole 17a has a diameter of 0.2 µm. After removing the photoresist film, a phosphorus-doped polysilicon film 8 of 0.6 µm in thickness is deposited on the entire BPSG layer 14 by a LPCVD technique. During this CVD process, as shown in FIG. 4C, the hole 17a is filled with the phosphorus-doped polysilicon.

The polysilicon layer 8 is then etched back entirely by a reactive ion etching technique to be left only in the hole 17a, producing a polysilicon plug 9 in the hole 17a, as shown in FIG. 4D. The bottom of the plug 9 is contacted with the impurity-doped region 2 and the top end thereof is slightly lower than the surface of the BPSG layer 14.

The BPSG layer 14 is then removed by a vapor phase HF etching technique. Thus, the top part of the plug 9 protrudes slightly from the polysilicon layer 4, as shown in FIG. 4E.

Subsequently, a Ti layer 11 of 0.03 µm in thickness is formed on the remaining polysilicon layer 4, the protruding polysilicon plug 9, and the exposed interlayer insulator film 33 by a sputtering technique, as shown in FIG. 4E. Then, the polysilicon layer 4 and the Ti layer 11 are subjected to a heat-treatment to react with each other, producing selectively a TiSi$_2$ layer 12 at the interface between the layers 4 and 12.

Finally, the unreacted Ti layer 11 and reaction products such as TiN are removed, resulting in the patterned silicide layer 12 formed on the remaining polysilicon layer 4. Thus, the silicide layer 12 is selectively formed in self-alignment with the underlying polysilicon layer 4 in the same way as that in the first embodiment.

The fabrication method shown in FIGS. 4A to 4F is different from that of the first embodiment in that the polysilicon layer 4 of the interconnection 15 is patterned to prior to the formation of the plug 9. Therefore, the same advantages as those in the first embodiment can be obtained.

FOURTH EMBODIMENT

Figure 6:
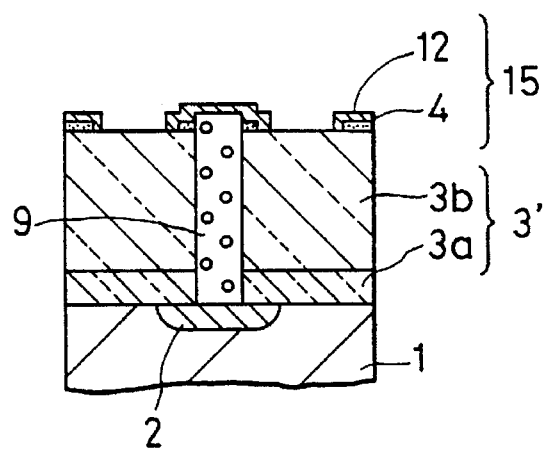
FIG. 6 is a partial cross-sectional view of a semiconductor device according to a fourth embodiment of the invention.

FIG. 6 shows a semiconductor device according to a fourth embodiment. In the above first and second embodiments, the interlayer insulator film 3 is formed by a single film such as a BPSG one. However, the film 3 may have a multilayer structure as shown in the third embodiment. As shown in FIG. 6, an interlayer insulator film 3' is made of a lower SiO$_2$ layer 3a and an upper BPSG layer 3b.

Since no BPSG layer is formed on the film 3', it is not necessary to provide an undoped SiO$_2$ layer at the top of the film 3', as shown in the third embodiment.

FIFTH EMBODIMENT

Figure 7:
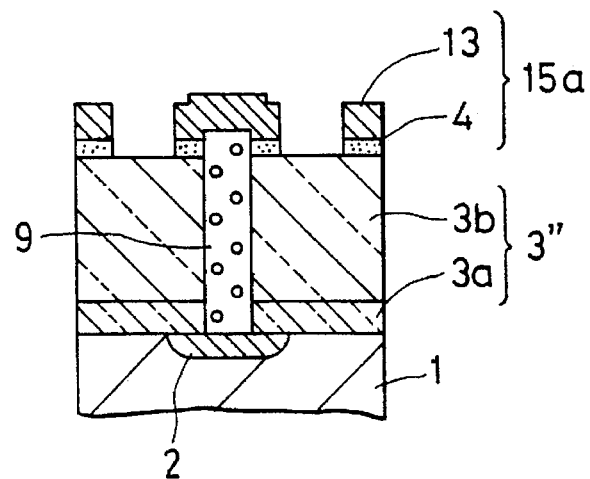
FIG. 7 is a partial cross-sectional view of a semiconductor device according to a fifth embodiment of the invention.

FIG. 7 shows a semiconductor device according to a fifth embodiment. As shown in FIG. 7, an interlayer insulator film 3" is made of a lower SiO$_2$ layer 3a and an upper BPSG layer 3b, similar to the fourth embodiment.

Since no BPSG layer is formed on the film 3", it is not necessary to provide an undoped SiO$_2$ layer at the top of the film 3", as shown in the third embodiment.

In the above first to fifth embodiments, the interconnection layers 15 and 15a each has the polycide structure. However, in the present invention, each of the layers 15 and 15a is not always necessary to have the polycide structure and may be made of a single conductor layer. In this case, the polysilicon layer 4 for the interconnection layer 15 or 15a can be cancelled in the first to fifth embodiments and a conductor layer such as the Ti layer 11 or the WSi layer 13 is formed directly on the interlayer insulator film 3, 3', 3" or 33.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A semiconductor device, comprising:
   a) a lower-level conductor layer formed in a semiconductor substrate;
   b) an interlayer insulator film, formed to cover the lower-level conductor layer, and having a penetrating hole;
   c) an upper-level conductor layer formed on the interlayer film, the upper-level conductor layer having a multilayer structure including:
      c2) a silicon sublayer; and
      c1) a metal silicide sublayer which contacts the silicon sublayer; and
   d) a conductor plug which is formed in the hole of the interlayer film and which electrically connects the lower-level conductor layer and the upper-level conductor layer, the conductor plug including:
      d1) a top part protruding from the silicon sublayer of the upper-level conductor layer, the top part having a top face and a side face which contact the metal silicide sublayer of the upper-level conductor layer to reduce contact resistance between the conductor plug and the upper-level conductor layer.

2. The device of claim 1, wherein:
   the conductor plug is made of polysilicon.

3. The device of claim 1, wherein:
   the silicon sublayer of the upper-level conductor layer includes polysilicon doped with an impurity at a doping concentration less than 1×10$^{20}$ atoms/cm$^3$.

4. The device of claim 1, wherein:
   the interlayer insulator film has a multilayer structure including a top layer of non-doped SiO$_2$.

5. The device of claim 1, wherein, in the upper-level conductor layer:
   the silicon sublayer includes a patterned polysilicon layer with an impurity at a doping concentration of less than 1×10$^{20}$ atoms/cm$^3$; and
   the metal silicide sublayer includes TiSi$_2$.

6. The device of claim 1, wherein, in the upper-level conductor layer:
   the silicon sublayer includes a patterned polysilicon layer with an impurity at a doping concentration of less than 1×10$^{20}$ atoms/cm$^3$; and
   the metal silicide sublayer includes WSi$_2$.

7. The device of claim 1, wherein the interlayer insulator film includes:
   a lower sublayer including SiO$_2$;
   a second sublayer including BPSG; and
   an upper sublayer including SiO$_2$ having no impurity doping.

8. The device of claim 1, wherein the interlayer insulator film includes:
   a lower sublayer including SiO$_2$; and
   an upper sublayer including BPSG.

9. The device of claim 8, wherein, in the upper-level conductor layer:
   the silicon sublayer includes a patterned polysilicon layer with an impurity at a doping concentration of less than 1×10$^{20}$ atoms/cm$^3$; and
   the metal silicide sublayer includes TiSi$_2$.

10. The device of claim 8, wherein, in the upper-level conductor layer:
    the silicon sublayer includes a patterned polysilicon layer with an impurity at a doping concentration of less than 1×10$^{20}$ atoms/cm$^3$; and
    the metal silicide sublayer includes WSi$_2$.

11. A semiconductor device, comprising:
    a) a lower-level conductor layer formed in a semiconductor substrate;
    b) an interlayer insulator film formed to cover the lower-level conductor layer, the interlayer insulator film having a first hole;
    c) an upper-level conductor layer formed on the interlayer insulator film and having a two-layer structure including:
       c1) a silicon sublayer formed on the interlayer insulator film and having a second hole positioned over the first hole; and
       c2) a metal silicide sublayer formed on the silicon sublayer; and
    d) a conductor plug, electrically connecting the lower-level conductor layer and the upper-level conductor layer, and formed to extend vertically within the first hole and the second hole, the conductor plug including:

d1) a bottom end which contacts the lower-level conductor layer; and d2) a top part of the conductor plug, protruding from the silicon sublayer through the second hole and having a top face and a side face which are covered by the metal silicide sublayer to reduce contact resistance between the conductor plug and the upper-level conductor layer.

12. The device of claim 11, wherein:

the silicon sublayer of the upper-level conductor layer includes polysilicon doped with an impurity at a doping concentration of less than $1 \times 10^{20}$ atoms/cm$^3$.

13. The device of claim 11, wherein:

the interlayer insulator film has a multilayer structure including a top layer of non-doped $SiO_2$.

14. The device of claim 11, wherein, in the upper-level conductor layer:

the silicon sublayer includes a patterned polysilicon layer with an impurity at a doping concentration of less than $1 \times 10^{20}$ atoms/cm$^3$; and the metal silicide sublayer includes $TiSi_2$.

15. The device of claim 11, wherein, in the upper-level conductor layer:

the silicon sublayer includes a patterned polysilicon layer with an impurity at a doping concentration of less than $1 \times 10^{20}$ atoms/cm$^3$; and the metal silicide sublayer includes $WSi_2$.

16. The device of claim 11, wherein the interlayer insulator film includes:

a lower sublayer including $SiO_2$;

a second sublayer including BPSG; and an upper sublayer including $SiO_2$ having no impurity doping.

17. The device of claim 11, wherein the interlayer insulator film includes:

a lower sublayer including $SiO_2$; and an upper sublayer including BPSG.

18. The device of claim 17, wherein, in the upper-level conductor layer:

the silicon sublayer includes a patterned polysilicon layer with an impurity at a doping concentration of less than $1 \times 10^{20}$ atoms/cm$^3$; and the metal silicide sublayer includes $TiSi_2$.

19. The device of claim 17, wherein, in the upper-level conductor layer:

the silicon sublayer includes a patterned polysilicon layer with an impurity at a doping concentration of less than $1 \times 10^{20}$ atoms/cm$^3$; and the metal silicide sublayer includes $WSi_2$.

* * * * *

UNITED STATES PATENT AND TRADEMARK OFFICE
CERTIFICATE OF CORRECTION

PATENT NO. : 5,641,991
DATED : June 24, 1997
INVENTOR(S) : Takashi Sakoh

It is certified that error appears in the above-identified patent and that said Letters Patent is hereby corrected as shown below:

col. 7, line 37, delete "1";

col. 8, line 43, after "layer"  --14 of about-- col. 9, line 59, delete "c2" and insert --c1--, claim 8, line 10;

col. 9, line 60, delete "c1" and insert --c2--, claim 8, line 11.

Signed and Sealed this

Thirteenth Day of January, 1998

Attest:

BRUCE LEHMAN

Attesting Officer

Commissioner of Patents and Trademarks